United States Patent [19]

McCarthy

[11] Patent Number: 4,508,163
[45] Date of Patent: Apr. 2, 1985

[54] HEAT SINKS FOR INTEGRATED CIRCUIT MODULES

[75] Inventor: Alfred F. McCarthy, Belmount, N.H.

[73] Assignee: Aavid Engineering, Inc., Laconia, N.H.

[21] Appl. No.: 458,833

[22] Filed: Jan. 18, 1983

[51] Int. Cl.³ .................. H01L 23/02; H01L 23/48
[52] U.S. Cl. ................................. 165/80 B; 357/81; 357/79
[58] Field of Search ............ 165/80 B, 80 D, DIG. 9, 165/177, 185; 357/81, 82, 79; 361/386, 381, 383, 388

[56] References Cited

U.S. PATENT DOCUMENTS

| | | | |
|---|---|---|---|
| 2,450,203 | 9/1948 | Morgan | 165/DIG. 9 |
| 2,454,357 | 11/1948 | Tolan | 165/DIG. 9 |
| 3,548,927 | 12/1970 | Spurling | 165/185 |
| 4,235,285 | 11/1980 | Johnson et al. | 165/82 |
| 4,408,220 | 10/1983 | Calabro | 357/81 |

Primary Examiner—William R. Cline
Assistant Examiner—John J. McGlew, Jr.
Attorney, Agent, or Firm—James E. Mrose

[57] ABSTRACT

In dissipating heat from miniature electronic devices, circuit modules, or the like, and particularly from dual-in-line package (DIP) type units having leads depending from opposite sides of a thin molded rectangular-parallelpiped body, an elongated sheet-metal strip of heat-radiating elements disposed above and in spaced relation to the top of the package has its opposite ends integrally connected with separate spaced heat-conducting clip members are cantilevered from it in different directions to fit respectively about the top and bottom surfaces of the package and to flex so as to accomodate insertion of the package between them and yet adjust themselves into abutments with those surfaces. Heat conducted away from the package by each of the cantilevered members first reaches a different end of the strip of heat-radiating elements, without interfering with the heat-exchange taking place along the opposite surfaces of the package clipped between the members. The two clip members are of configurations exhibiting different stiffness, and are cantilevered from the heat-radiating strip by way of different-length connections, such that these members, once spread widely apart, tend not to maintain the parallelism needed to insure optimum abutments and heat-transfers from a package which has been forcibly wedged between them; that difficulty is corrected by indented stiffening ribbing in the longer cantilevered connection, and that same ribbing is employed to establish a mechanical spacing and thermal isolation from the inner end of an inserted package.

2 Claims, 7 Drawing Figures

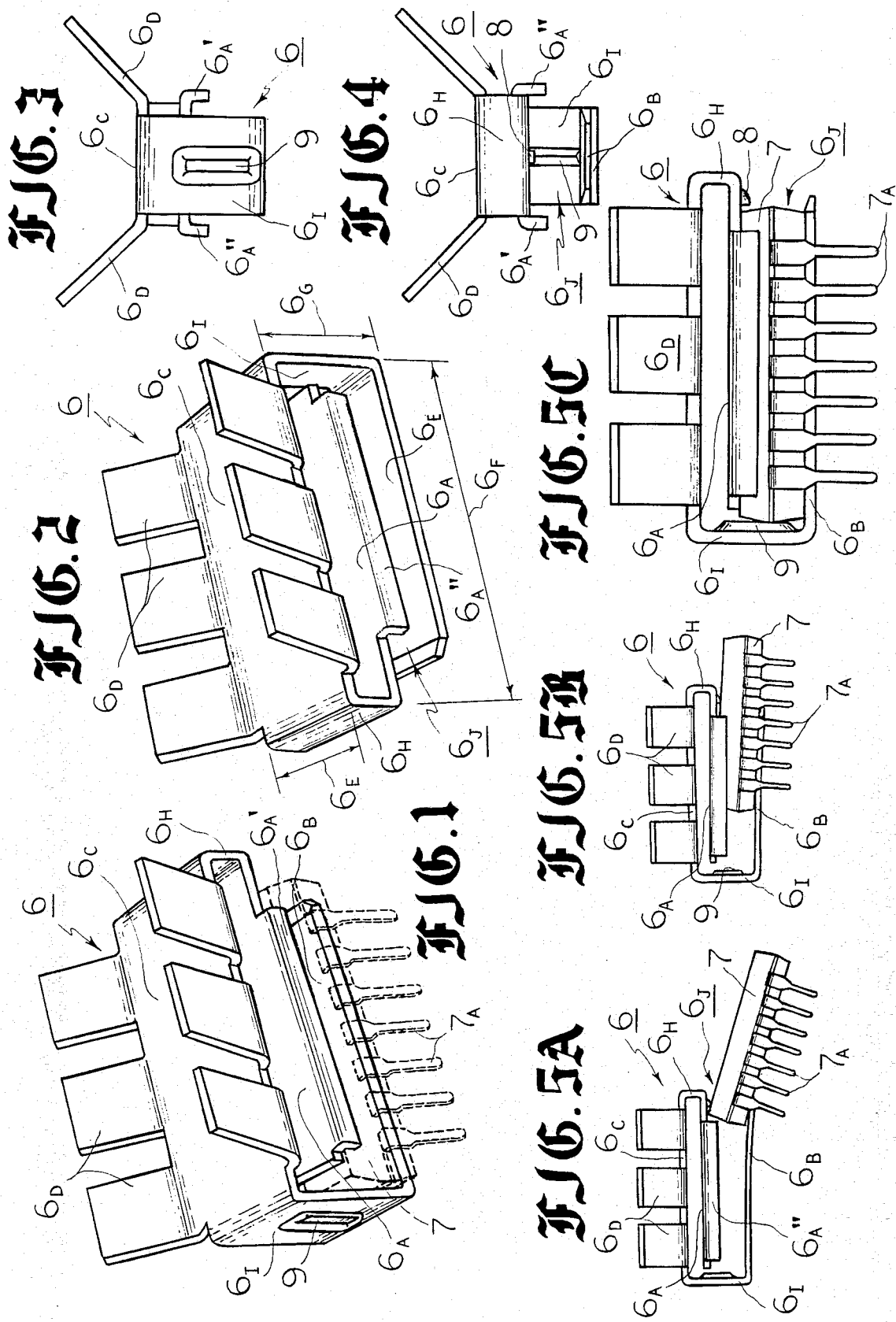

HEAT SINKS FOR INTEGRATED CIRCUIT MODULES

BACKGROUND OF THE INVENTION

The present invention relates to improvements in provisions for dissipating heat from miniature electrical packages of components or devices, and, in one particular aspect, to novel and advantageous stamped-metal heat sinks of economical construction which readily accept and securely attach themselves in efficient heat-exchange relationship to modules of the dual-in-line package type, with improved release of unwanted thermal energy to ambient environment being effected by a broad-area radiating member held in favorably-spaced relation to the package by integral spring-clip members uniquely arranged to flex into intimate engagements with opposed surfaces of the package and which separately and without interference with one another conduct heat from those surfaces to the main radiating member. Unbalanced resiliencies exhibited by the spring-clip members, which can impair their flexing into optimum abutments with the package surfaces once they have been forcibly wedged apart by insertion of the package, are offset by stiffening indentations of the stamped metal at flexure sites where yielding tendencies are excessive, and the same indentations are preferably disposed to aid in spacings which thermally isolate package end surfaces and promote maximum cooling.

Miniature electrical and electronic units, such as those in which devices or components or circuits are packaged in molded modular form for automated interconnections in printed-circuit board environments, commonly have power-handling limitations which are largely determined by their abilities to expel internally-generated heat and thereby avoid general or localized thermal degradations or failures within them. Performance of such units can often be very significantly extended or enlarged with the aid of finned metal extrusions or stampings which will conduct and radiate heat away from thermally-vulnerable regions, thereby upgrading relatively low-cost items into more demanding and valuable service than their uncooled ratings would otherwise allow. Some units, and notably those of the dual-in-line package (DIP) type, have both upper and lower broad-area surfaces from which heat should best be extracted efficiently if the units are to operate safely nearer theoretical peaks of performance. It has been known to form the cover of the sealed enclosure of a semiconductor package as an integral heat-radiating member, and to enhance the flow of heat from at least the top of the package by way of a pillow in which a thermally-conductive material is contained by a film (U.S. Pat. No. 4,092,697). And, in situations where the package is to be cooled with the aid of accessory heat-sink attachments, it has been proposed that a winged sheet-metal radiator be held on top of an integrated-circuit package by pairs of fingers struck from the same metal and disposed to grasp edges of the package; more secure fastening has also been available through soldering of special tabs and fingers of the mated items (U.S. Pat. No. 3,670,215). Along the latter lines, it has also been a practice to bond light-weight heat-radiators directly to the top of a package, using an adhesive which conducts well. More conveniently, however, and offering more efficient broad-area contacting as well, a small sheet-metal heat-sink is fashioned either as a one-part or two-part spring clip which fits not only along the top of an elongated package but also fully along the bottom, where commonly the greater heat build-up tends to occur and yet where there is little space available between the bottom of the package and the confronting top surface of a printed-circuit board on which the package is mounted. My joint U.S. Pat. Nos 4,203,488 and 4,235,285 disclose such clip-type heat sinks. In some instances, mechanical locking of a spring-clip heat sink may be adequately provided with the aid of detenting, such as is described in connection with the tab-engaging units in U.S. Pat. Nos. 3,893,161 and 4,012,769; in other cases, the clasp end of a clip unit such as is featured in my said U.S. Pat. No. 4,235,285 may simply be omitted and the unit permitted to yieldably clamp itself in place.

As appears more fully hereinafter, a unique and advantageous arrangement for withdrawing and dissipating excess thermal energy from small electronic packages or modules includes a self-fastenting clip unit in which two heat-conducting elements engage opposite surfaces of such a package and independently conduct heat away from it to a third integral element which effects an efficient release of such heat to the surrounding or ambient atmosphere. That folded-back arrangement of elements bears some superficial resemblance to a prior resilient accessory clip used to press a separate fingered heat-dissipation member into intimate contact with a component which is to be cooled (U.S. Pat. No. 3,548,927), but it will be appreciated that the clip there is not itself a primary heat-dissipating device and it functions instead as a mere resilient clamp for a component and dissipator.

SUMMARY OF THE INVENTION

The present invention is aimed at providing miniature self-fastened heat sinks which are especially useful in the cooling of dual-in-line (DIP) integrated-circuit (IC) packages, or the like, and which lend themselves to economical manufacture, to ease and convenience of assembly into place, and to efficient non-interfering transfers of heat away from broad areas of both top and bottom surfaces of such packages. In one preferred embodiment, a stamped sheet-metal heat sink, of a material which has a sufficient degree of resilience for the intended purposes, is fashioned as a spring clip having three folded sections. An elongated middle section, from the ends of which two other integral elongated sections are cantilevered and folded back in parallel, acts as the principal heat radiator and, for that purpose, is held by the other two sections in a stand-off spaced relation to a package clasped between those sections. Preferably, the middle section bristles with fins or has other provisions for broad-area interfacing or thermal matching with ambient atmosphere. The two end sections are so cantilevered and folded back in opposite directions from extremities of the middle section that they both lie to one side of it and are normally in a substantially parallel relationship complementing that of the top and bottom surfaces of the package which they are designed to abut and clasp between them; heat is therefore conducted away from those surfaces along independent paths to the middle heat-dissipating section. The two end sections are necessarily of different distances from the middle section and therefore tend to exhibit different resiliencies when they are spread apart upon insertion of an electronic package between them, with the result that they may tend to flex differently and may not make the same desirably full-area contacting with both the top and bottom package surfaces at the same time. In compensation for those unwanted tendencies, the longer end connection is stiffened by at least one longitudinal indentation or stamped ribbing, which urges the flexing of the lower end section to match that of the upper end section and to cause both sections to abut the upper and lower package surfaces fully and about equally; conduction from both surfaces to the heat-dissipating middle section is optimized. Preferably the indenting is inward, toward the site of the clasped package, such that it helpfully serves to space and isolate the inner end of the clasped package from heat being conducted around that end from the bottom.

Accordingly, it is one of the objects of this invention to provide novel and improved clasp-type heat sinks, for attachment to miniature integrated-circuitry packages or the like, which efficiently conduct heat from both top and bottom surfaces of such packages independently to a common heat-radiating structure.

A further object is to provide unique and advantageous self-fastening heat sinks of low-cost sheet-metal construction which lend themselves to uncomplicated mating with and efficient withdrawal and dissipations of heat from DIP circuit modules and the like.

Still further, it is an object to provide a sheet-metal IC-module heat sink having a pair of flexible contacting and clasping members which are stiffened and shaped to open and close about a module so as to optimize broad-area heat-transfer characteristics between them and to space and lock itself in preferred relationship to the module.

BRIEF DESCRIPTION OF THE DRAWINGS

Although the aspects of this invention which are considered to be novel are expressed in the appended claims, further details as to preferred practices and as to further objects and features thereof may be most readily comprehended through reference to the following detailed description when taken in connection with the accompanying drawings, wherein:

FIG. 1 is a pictorial view of an improved heat-sink attachment in operative heat-dissipating clasping relationship to a miniature circuit module; the latter being designated by dashed linework;

FIG. 2 portrays the attachment of FIG. 1 alone, and as viewed from the opposite end;

FIG. 3 is an end view of the heat sink of FIG. 2, looking toward the right-hand end thereof;

FIG. 4 is an end view of the heat sink of FIG. 2, looking toward the left-hand end thereof;

FIG. 5A is a side view of the heat sink, as shown in FIG. 1, but on a reduced scale, as it is being opened to admit a miniature circuit module which is in the process of being inserted;

FIG. 5B is a side view of the same heat sink, on the same reduced scale, with the circuit module inserted about midway; and FIG. 5C is a side view of the same heat sink, on the same scale as in FIGS. 1-4, with the circuit module fully inserted.

DETAILED DESCRIPTION OF THE PREFERRED EMBODIMENTS

Having reference to the drawings, wherein like reference characters designate identical or corresponding parts throughout the different views, and more particularly to FIG. 1 thereof, one embodiment of an improved heat-sinking arrangement, 6, is shown, via dashed linework, in a cooperative mated relationship with a multi-terminal microcircuit module 7, of the dual-in-line package (DIP) type having terminals 7A depending from opposite sides of its thin rectangular-parallelepiped molded plastic body. As is well known, such elongated electronics packages may contain devices, multiple components, and/or integrated circuitry, with fewer or more than the illustrated number of pins or terminals. Generally, the lower surface of such a package is likely to exhibit the greater temperatures, unless cooled, because of the presence nearby of a lower substrate on which various internal active components are mounted in common. Such packages are manufactured in lines of essentially standard widths and heights, with lengths and numbers of pins varying according to the needs of what is being packaged; however, the heights of even such standardized plastic cases can vary as much as 0.03 inch for units having cross-sections of about $\frac{1}{8} \times \frac{1}{4}$ inch, and that variation must be accommodated by a heat-sinking arrangement which fits over the case.

Importantly, the stamped sheet-metal heat-sinking arrangement 6 has two elongated, substantially flat, and normally-parallel members, 6A and 6B, which are disposed to engage with and make intimate broad-area contacts with the flat upper and lower surfaces, respectively, of the module or package 7. The metal of the stamping should be of sufficient resilience or elasticity to act as enough of a spring, in a unit having the illustrated configuration and relative proportions, for the members 6A and 6B to clasp and hold themselves in firm abutting relationships with those upper and lower surfaces of the module. Aluminum stock can even serve those purposes, for example, and functions as an excellent conductor of the package heat which must be withdrawn and brought to the third member, 6C, for convective dissipation promoted by its radiating fins 6D. Thin lower member 6B (example: just over 1/64 inch) takes up very little room beneath the module, and is readily fitted there within the space normally allotted between the module and a printed-circuit board onto which it is held when its pins are socketed through apertures and wave-soldered into connections with various conductors. Except for its fins 6D, a typical heat sink such as that shown (FIG. 2) may measure generally about $\frac{1}{4}$ inch in width, 6E, $\frac{7}{8}$ inch in overall length, 6F, and $\frac{1}{4}$ inch in basic height, 6G, and the said lower member 6B, is intentionally made somewhat narrower (example: just over 3/16 inch) so that it will not be likely to interfere with the somewhat wider-spread rows of delicate pins 7A of an associated module. However, upper member 6A is of a width fully spanning the width of such a module and, in addition, has short downwardly-turned overhanging edges, 6A' and 6A", which help to form a shallow channel for guidance of the module as it is being inserted and for improved lateral holding and centering of the module once it is in place.

The upper and lower clasp members, 6A and 6B, are integral with the intermediate heat-radiating member 6C, each being separately cantilevered from a different end of that middle member. Their respective end connections, 6H and 6I, are of different lengths, allowing the two clasp members to extend freely in opposite directions in spaced and nearby parallel relationship. Preferably, those clasp members are initially biased so that they slope slightly toward one another in direction of their open end 6J; such slight inclination tends to promote settlement of the members into good broad-area contacts with upper and lower surfaces of a module inserted between them. Importantly, each of the two members conducts heat away from the module wholly independently of the other, via their end connections 6H and 6I, and to opposite ends of the elongated heat-radiating member 6C. This arrangement is particularly advantageous in that the heat being conducted away from the lower surface of the module to the radiating fins does not have to travel first across the upper surface, where it could interfere with the efficient cooling which should also be taking place there as well. A simple clasp in which the upper and lower members are joined directly would not offer that distinct advantage and significant improvement.

Heat dissipation from the unit is effected mainly by convective cooling achieved by intermediate member 6C, and, when good thermal matching to the ambient atmosphere is realized through use of fins 6D, or the equivalent, there is little likelihood that heat from one of the clasp members can be deleteriously conducted back to an associated module through the other. That is true even if connection 6H is disposed not at the narrower end of the radiating member but alongside it. In lieu of the illustrated fins, there may instead be other provisions for establishing good thermal matching, and heat transfer, between member 6C and the ambient, such as perforations, ribbon-like or twisted sections of material, tabs, etc.

As is represented in FIG. 5A, a module, 7, is inserted into the heat-sink unit 6 from one narrower end thereof, namely via the aforementioned end opening 6J. An end of the module is first wedged between the free end of lower clasp member 6B and the nearby connection end of stiffer upper clasp member 6A, deflecting the member 6B downwardly. Thereafter, when the module is pressed further into the module, such as to about two-thirds of the way in (FIG. 5B), the upper clasp member is also leveraged to deflect appreciably, upwardly as shown. Ultimately, when the module is in its fully-inserted position (FIG. 5C), both the upper and lower clasp members should lie substantially flat against the parallel upper and lower surfaces of the module, for efficient conductive transfers of heat away from those surfaces. A downwardly-extending detent or catch, 8, near the connection end of upper member 6A, helps to lock the module in place, and a stop 9 near the innermost end of the module-receiving space makes small-area contact with the module as it keeps it isolated from heat travelling through end connection 6I.

The relatively short end connection, 6H, by which the upper clasp member 6A is cantilevered, and the stiffness imparted to that same member by the depending channel-forming overhanging edges 6A' and 6A", both tend to make its flexing characteristics significantly different from those of the narrower and unstiffened lower clasp member 6B which has a longer end connection 6I. Accordingly, the lower and more yieldable clasp member 6B would normally flex much more readily as a module is being inserted, and especially when the metal involved is somewhat soft or very thin. Needlessly large bending or spreading of that member in that way can cause it to deform and take on a deflected set which thereafter will prevent it from assuming the needed broad-area contacting with the bottom of an inserted module. For purposes of overcoming such difficulties, the longer flexural end connection, 6I, is made more rigid by a longitudinally-extending indentation, 9, which runs for most of the length of that connection. The stiffening effect produced by that indentation develops more of a match between the resiliencies of the upper and lower clasp members, and promotes their assuming a desirable parallelism once a module has been fully inserted between them. More than one such indentation, or ribbing, or equivalent mechanical stiffening by stamped shaping may be used. As is shown, the indentation preferably extends inwardly toward the space to be occupied by an associated module, so that it may also function as a mechanical stop and spacer, preventing the heat which is being conducted through the end connection from being passed into the inner end of such a module.

Modules of various lengths and having different numbers of terminals may be accommodated, by lengthening or shortening the members which form the three section heat sink. Also the entire unit may be scaled in overall size to operate with modules or other packages, with or without dual-in-line rows of pins, of different size and construction from that which has been chosen for illustration. Although end connection 6H has been shown as a short element, it may be a folded-back longer section, nested between the upper clasp member and the heat-radiating member and affording further flexibility because of that augmented length of connection. Also, the upper clasp member may be formed with heat-radiating fins or the like extending from ends of its channel flanges 6A' and 6A". It should therefore be understood that the specific embodiments and practices shown and described herein have been presented by way of disclosure, rather than limitation, and that various modifications, combinations and substitutions may be effected by those skilled in the art without departure in spirit or scope from this invention in its broader aspects and as set forth in the appended claims.

What I claim as new and desire to secure by Letters Patent of the United States is:

1. One-piece heat-sink apparatus for an electronics package the body of which has the general form of a thin elongated rectangular parallelepiped, comprising first, second and third elongated elements integrally connected in series by first and second connection means, all of said elements and connection means being formed of thin sheet metal, said first and second elements being held in substantially parallel spaced alignment with another and with said third element adjacent one side thereof by said connection means, said first connection means holding said first element in a cantilevered relation to one end of said third element at substantially a first distance therefrom, said second connection means holding said second element in a cantilevered relation to said third element at substantially a second distance therefrom which is less than said first distance, said third element being exposed to the ambient environment and being shaped for release thereto of heat conducted to it from the package independently from said first and second elements, said first element being substantially flat and proportioned to about closely and substantially coextensively with one surface of the package, and elongated stiffening means stamped as part of said first connection means and imparting to the cantilevered combination of said first element and said first connection means a stiffening which tends to approach that of the cantilevered combination of said second element and said second connection means, whereby, upon insertion of such a package between said first and second elements they tend to flex cooperatively and allow said first element to clasp itself in close abutting relationship with the nearby surface of the package.

2. One-piece heat-sink apparatus as set forth in claim 1 wherein said stiffening means includes at least one narrow longitudinal indentation stamped into material of said first connection means and extending inwardly toward the space between said first and second elements, said indentation providing a mechanical stop of small area disposed for engagement with the inner end of a package inserted between said first and second elements to thereby prevent substantial amounts of heat being conducted by said first connection means from being returned to the package.

* * * * *